US012627264B2

(12) United States Patent
Lehtola

(10) Patent No.: US 12,627,264 B2
(45) Date of Patent: May 12, 2026

(54) DOHERTY POWER AMPLIFIERS WITH CONTROLLABLE CAPACITOR FOR TUNING HARMONIC TERMINATION AND INVERTER

(71) Applicant: Skyworks Solutions, Inc., Irvine, CA (US)

(72) Inventor: Philip John Lehtola, Cedar Rapids, IA (US)

(73) Assignee: Skyworks Solutions, Inc., Irvine, CA (US)

( * ) Notice: Subject to any disclaimer, the term of this patent is extended or adjusted under 35 U.S.C. 154(b) by 300 days.

(21) Appl. No.: 18/493,019

(22) Filed: Oct. 24, 2023

(65) Prior Publication Data

US 2024/0146250 A1 May 2, 2024

Related U.S. Application Data

(60) Provisional application No. 63/381,256, filed on Oct. 27, 2022.

(51) Int. Cl.
| | |
|---|---|
| H03F 1/02 | (2006.01) |
| H03F 1/56 | (2006.01) |
| H03F 3/24 | (2006.01) |

(52) U.S. Cl.
CPC ........... H03F 1/0288 (2013.01); H03F 1/565 (2013.01); H03F 3/245 (2013.01); *H03F 2200/387* (2013.01); *H03F 2200/451* (2013.01)

(58) Field of Classification Search
CPC ........ H03F 1/0288; H03F 1/565; H03F 3/245; H03F 2200/387; H03F 2200/451; H03F 3/195

USPC .......................................................... 455/73
See application file for complete search history.

(56) References Cited

U.S. PATENT DOCUMENTS

| | | | |
|---|---|---|---|
| 8,611,836 | B2 | 12/2013 | Ripley et al. |
| 9,041,472 | B2 | 5/2015 | Chen et al. |
| 9,419,567 | B2 | 8/2016 | Ripley et al. |
| 9,520,835 | B2 | 12/2016 | Ko et al. |
| 9,602,056 | B2 | 3/2017 | Lehtola |
| 9,621,118 | B2 | 4/2017 | Ripley et al. |
| 9,621,119 | B2 | 4/2017 | Lehtola |

(Continued)

OTHER PUBLICATIONS

US 9,490,751 B2, 11/2016, Ko et al. (withdrawn)

*Primary Examiner* — Eugene Yun
(74) *Attorney, Agent, or Firm* — Knobbe, Martens, Olson and Bear, LLP

(57) ABSTRACT

Doherty power amplifiers with a controllable capacitor are disclosed. In certain embodiments, a Doherty power amplifier includes a carrier amplifier that amplifies a first radio frequency (RF) input signal, a peaking amplifier that amplifies a second RF input signal, and a combiner having a first input coupled to an output of the carrier amplifier, a second input coupled to an output of the peaking amplifier, and an output that provides a combined RF output signal. The combiner includes an inverter for providing impedance inversion between the first input and the output of the combiner, and a first controllable capacitor and a first inductor in series and operable to provide harmonic termination to the output of the carrier amplifier. A capacitance of the first controllable capacitor is controllable to tune both the inverter and the harmonic termination of the carrier amplifier.

20 Claims, 12 Drawing Sheets

(56) References Cited

U.S. PATENT DOCUMENTS

| | | | |
|---|---|---|---|
| 9,654,155 B2 | 5/2017 | Lehtola | |
| 9,698,734 B2 | 7/2017 | Lehtola et al. | |
| 9,698,736 B2 | 7/2017 | Ripley et al. | |
| 9,712,125 B2 | 7/2017 | Lehtola et al. | |
| 9,722,547 B2 | 8/2017 | Ripley et al. | |
| 9,780,741 B2 | 10/2017 | Ripley et al. | |
| 9,787,260 B2 | 10/2017 | Lehtola | |
| 9,806,681 B2 | 10/2017 | Lehtola | |
| 9,838,058 B2 | 12/2017 | Pehlke et al. | |
| 9,893,684 B2 | 2/2018 | Lehtola | |
| 9,893,687 B2 | 2/2018 | Lehtola | |
| 9,899,961 B2 | 2/2018 | Lehtola et al. | |
| 9,923,523 B2 | 3/2018 | Lehtola et al. | |
| 9,935,594 B2 | 4/2018 | Lehtola et al. | |
| 9,979,349 B2 | 5/2018 | Lehtola et al. | |
| 9,991,850 B2 | 6/2018 | Lehtola et al. | |
| 10,044,398 B2 | 8/2018 | Lehtola et al. | |
| 10,084,411 B2 | 9/2018 | Lehtola et al. | |
| 10,116,274 B2 | 10/2018 | Ripley et al. | |
| 10,177,711 B2 | 1/2019 | Lehtola et al. | |
| 10,218,321 B2 | 2/2019 | Lehtola et al. | |
| 10,243,517 B2 | 3/2019 | Lehtola et al. | |
| 10,250,202 B2 | 4/2019 | Lehtola et al. | |
| 10,277,174 B2 | 4/2019 | Lehtola | |
| 10,312,867 B2 | 6/2019 | Lehtola et al. | |
| 10,340,862 B2 | 7/2019 | Lehtola et al. | |
| 10,483,641 B2 | 11/2019 | Lehtola | |
| 10,554,177 B2 | 2/2020 | Lyalin et al. | |
| 10,615,835 B2 | 4/2020 | Pehlke et al. | |
| 10,693,422 B2 | 6/2020 | Pan et al. | |
| 10,756,677 B2 | 8/2020 | Lehtola | |
| 10,771,024 B2 | 9/2020 | Zampardi et al. | |
| 10,778,149 B2 | 9/2020 | Lehtola | |
| 10,784,823 B2 | 9/2020 | Lehtola | |
| 10,790,783 B2 | 9/2020 | Lehtola | |
| 10,804,866 B2 | 10/2020 | Lehtola | |
| 10,804,867 B2 | 10/2020 | Lehtola | |
| 10,880,764 B2 | 12/2020 | Ripley et al. | |
| 10,892,715 B2 | 1/2021 | Pan et al. | |
| 10,917,056 B2 | 2/2021 | Lehtola et al. | |
| 11,018,628 B2 | 5/2021 | Lehtola | |
| 11,025,209 B2 | 6/2021 | Lehtola | |
| 11,057,003 B2 | 7/2021 | Ripley et al. | |
| 11,070,174 B2 | 7/2021 | Lyalin et al. | |
| 11,165,392 B2 | 11/2021 | Lehtola | |
| 11,239,800 B2 | 2/2022 | Drogi et al. | |
| 11,264,958 B2 | 3/2022 | Lehtola | |
| 11,444,576 B2 | 9/2022 | Drogi et al. | |
| 11,451,199 B2 | 9/2022 | Ripley et al. | |
| 11,502,646 B2 | 11/2022 | Lyalin et al. | |
| 11,545,938 B2 | 1/2023 | Lehtola et al. | |
| 11,545,947 B2 | 1/2023 | Lehtola et al. | |
| 11,552,598 B2 | 1/2023 | Pan et al. | |
| 11,575,349 B2 | 2/2023 | Lehtola | |
| 11,637,535 B2 | 4/2023 | Ripley et al. | |
| 11,683,013 B2 | 6/2023 | Drogi et al. | |
| 11,711,057 B2 | 7/2023 | Lehtola | |
| 11,729,645 B2 | 8/2023 | Ripley et al. | |
| 2015/0326181 A1 | 11/2015 | Chen et al. | |
| 2015/0326183 A1 | 11/2015 | Chen et al. | |
| 2015/0349741 A1 | 12/2015 | Lehtola | |
| 2016/0181990 A1 * | 6/2016 | Ahmed | H03F 1/565 |
| | | | 330/296 |
| 2016/0241206 A1 | 8/2016 | Lehtola | |
| 2017/0141734 A1 | 5/2017 | Lehtola | |
| 2019/0097582 A1 | 3/2019 | Lehtola | |
| 2020/0091870 A1 | 3/2020 | Lehtola et al. | |
| 2020/0373892 A1 * | 11/2020 | Kim | H03F 1/56 |
| 2021/0036661 A1 | 2/2021 | Lehtola | |
| 2022/0021340 A1 | 1/2022 | Lehtola | |
| 2022/0255508 A1 | 8/2022 | Lehtola et al. | |
| 2022/0255514 A1 | 8/2022 | Lehtola | |
| 2022/0321074 A1 | 10/2022 | Lehtola | |
| 2022/0385237 A1 | 12/2022 | Lehtola et al. | |
| 2022/0385328 A1 | 12/2022 | Lehtola | |
| 2022/0393653 A1 | 12/2022 | Zampardi, Jr. et al. | |
| 2023/0020495 A1 | 1/2023 | Lehtola et al. | |
| 2023/0095390 A1 | 3/2023 | Lehtola | |
| 2023/0097146 A1 | 3/2023 | Lehtola | |
| 2023/0112095 A1 | 4/2023 | Lehtola | |
| 2023/0198469 A1 * | 6/2023 | Ladhani | H03F 3/245 |
| | | | 455/114.3 |
| 2023/0216457 A1 | 7/2023 | Liu et al. | |
| 2023/0253940 A1 | 8/2023 | Lehtola et al. | |
| 2023/0261616 A1 | 8/2023 | Lehtola et al. | |
| 2023/0327607 A1 | 10/2023 | Lehtola | |
| 2023/0361732 A1 | 11/2023 | Lehtola | |
| 2023/0361734 A1 | 11/2023 | Lehtola | |

* cited by examiner

<u>FIG.3</u>

CTRL2=OFF CTRL1=OFF
CTRL2=OFF CTRL1=ON
CTRL2=ON  CTRL1=OFF

DOHERTY POWER AMPLIFIERS WITH CONTROLLABLE CAPACITOR FOR TUNING HARMONIC TERMINATION AND INVERTER

CROSS-REFERENCE TO RELATED APPLICATIONS

This application claims the benefit of priority under 35 U.S.C. § 119 of U.S. Provisional Patent Application No. 63/381,256, filed Oct. 27, 2022 and titled "DOHERTY POWER AMPLIFIERS WITH CONTROLLABLE CAPACITOR FOR TUNING HARMONIC TERMINATION AND INVERTER," which is herein incorporated by reference in its entirety.

BACKGROUND

Field

Embodiments of the invention relate to electronic systems, and in particular, to radio frequency (RF) electronics.

Description of the Related Technology

Power amplifiers are used in RF communication systems to amplify RF signals for transmission via antennas.

Examples of RF communication systems with one or more power amplifiers include, but are not limited to, mobile phones, tablets, base stations, network access points, customer-premises equipment (CPE), laptops, and wearable electronics. For example, in wireless devices that communicate using a cellular standard, a wireless local area network (WLAN) standard, and/or any other suitable communication standard, a power amplifier can be used for RF signal amplification. An RF signal can have a frequency in the range of about 30 kHz to 300 GHz, such as in the range of about 400 MHz to about 7.125 GHz for Frequency Range 1 (FR1) of the Fifth Generation (5G) communication standard or in the range of about 24.250 GHz to about 71.000 GHz for Frequency Range 2 (FR2) of the 5G communication standard.

SUMMARY

In certain embodiments, the present disclosure relates to a power amplifier system. The power amplifier system includes a carrier amplifier configured to amplify a first radio frequency input signal, a peaking amplifier configured to amplify a second radio frequency input signal, and a combiner having a first input electrically connected to an output of the carrier amplifier, a second input electrically connected to an output of the peaking amplifier, and an output that provides a radio frequency output signal. The combiner includes an inverter configured to provide an impedance inversion between the first input and the output of the combiner, and a first inductor and a first controllable in series and operable to provide harmonic termination to the output of the carrier amplifier. The first controllable capacitor having a capacitance that is controllable to tune both the inverter and the harmonic termination of the carrier amplifier.

In some embodiments, the combiner further includes a second inductor and a second controllable capacitor in series and operable to provide harmonic termination to the output of the peaking amplifier. According to a number of embodiments, the first inductor and the first controllable capacitor are electrically connected in series between the output of the carrier amplifier and a ground voltage, and the second inductor and the second controllable capacitor are electrically connected in series between the output of the carrier amplifier and the ground voltage. In accordance with several embodiments, the inverter is connected between the output of the carrier amplifier and the output of the peaking amplifier.

In various embodiments, the inverter includes a quarter wave transformer.

In several embodiments, the power amplifier system further includes an input splitter configured to receive a radio frequency transmit signal and to output the first radio frequency input signal and the second radio frequency input signal. According to a number of embodiments, the power amplifier system further includes an input signal selection circuit configured to select the radio frequency transmit signal from amongst two or more radio frequency transmit signals each associated with a different frequency band. In accordance with various embodiments, the radio frequency transmit signal is selected based on a band signal, the band signal further operable to control the capacitance of the first controllable capacitor.

In some embodiments, the power amplifier system further includes a series matching inductor connected between the output of the combiner and a radio frequency output terminal, and a shunt matching capacitor in shunt to the radio frequency output terminal.

In several embodiments, the carrier amplifier includes a class AB bias circuit, and the peaking amplifier includes a class C bias circuit.

In some embodiments, the first controllable capacitor and the first inductor provide harmonic termination at a second harmonic frequency of the first radio frequency input signal.

In various embodiments, the first controllable capacitor includes a plurality of circuit branches electrically connected in parallel, the plurality of circuit branches including a first circuit branch with a fixed capacitor and a second circuit branch with a series combination of a first field-effect transistor switch and a first switchable capacitor. According to a number of embodiments, the plurality of circuit branches further include a third circuit branch with a second field-effect transistor switch and a second switchable capacitor.

In certain embodiments, the present disclosure relates to a method of radio frequency amplification. The method includes amplifying a first radio frequency input signal using a carrier amplifier that has an output connected to a first input of a combiner, amplifying a second radio frequency input signal using a peaking amplifier that has an output connected to a second input of the combiner, providing an impedance inversion between the first input of the combiner and an output of the combiner using an inverter of the combiner, providing harmonic termination to the output of the carrier amplifier using a first inductor and a first controllable capacitor of the combiner, the first inductor and the first controllable capacitor in series, and controlling a capacitance of the first controllable capacitor to tune both the inverter and the harmonic termination of the carrier amplifier.

In certain embodiments, the present disclosure relates to a mobile device. The mobile device includes an antenna configured to transmit a radio frequency output signal, and a front end-system including a power amplifier system. The power amplifier system includes a carrier amplifier configured to amplify a first radio frequency input signal, a peaking amplifier configured to amplify a second radio frequency input signal, and a combiner having a first input electrically connected to an output of the carrier amplifier, a second input electrically connected to an output of the peaking amplifier, and an output that provides the radio frequency output signal. The combiner includes an inverter configured to provide an impedance inversion between the first input and the output of the combiner, and a first inductor and a first controllable in series and operable to provide harmonic termination to the output of the carrier amplifier. The first controllable capacitor has a capacitance that is controllable to tune both the inverter and the harmonic termination of the carrier amplifier.

In some embodiments, the combiner further includes a second inductor and a second controllable capacitor in series and operable to provide harmonic termination to the output of the peaking amplifier. According to a number of embodiments, the first inductor and the first controllable capacitor are electrically connected in series between the output of the carrier amplifier and a ground voltage, and the second inductor and the second controllable capacitor are electrically connected in series between the output of the carrier amplifier and the ground voltage. In accordance with several embodiments, the inverter is connected between the output of the carrier amplifier and the output of the peaking amplifier.

In various embodiments, the inverter includes a quarter wave transformer.

In several embodiments, the power amplifier system further includes an input splitter configured to receive a radio frequency transmit signal and to output the first radio frequency input signal and the second radio frequency input signal. According to a number of embodiments, the power amplifier system further includes an input signal selection circuit configured to select the radio frequency transmit signal from amongst two or more radio frequency transmit signals each associated with a different frequency band. In accordance with various embodiments, the radio frequency transmit signal is selected based on a band signal, the band signal further operable to control the capacitance of the first controllable capacitor.

In some embodiments, the power amplifier system further includes a series matching inductor connected between the output of the combiner and a radio frequency output terminal, and a shunt matching capacitor in shunt to the radio frequency output terminal.

In several embodiments, the carrier amplifier includes a class AB bias circuit, and the peaking amplifier includes a class C bias circuit.

In various embodiments, the first controllable capacitor and the first inductor provide harmonic termination at a second harmonic frequency of the first radio frequency input signal.

In some embodiments, the first controllable capacitor includes a plurality of circuit branches electrically connected in parallel, the plurality of circuit branches including a first circuit branch with a fixed capacitor and a second circuit branch with a series combination of a first field-effect transistor switch and a first switchable capacitor. According to a number of embodiments, the plurality of circuit branches further include a third circuit branch with a second field-effect transistor switch and a second switchable capacitor.

BRIEF DESCRIPTION OF THE DRAWINGS

Embodiments of this disclosure will now be described, by way of non-limiting example, with reference to the accompanying drawings.

DETAILED DESCRIPTION OF CERTAIN EMBODIMENTS

Figures 1A, 1B:
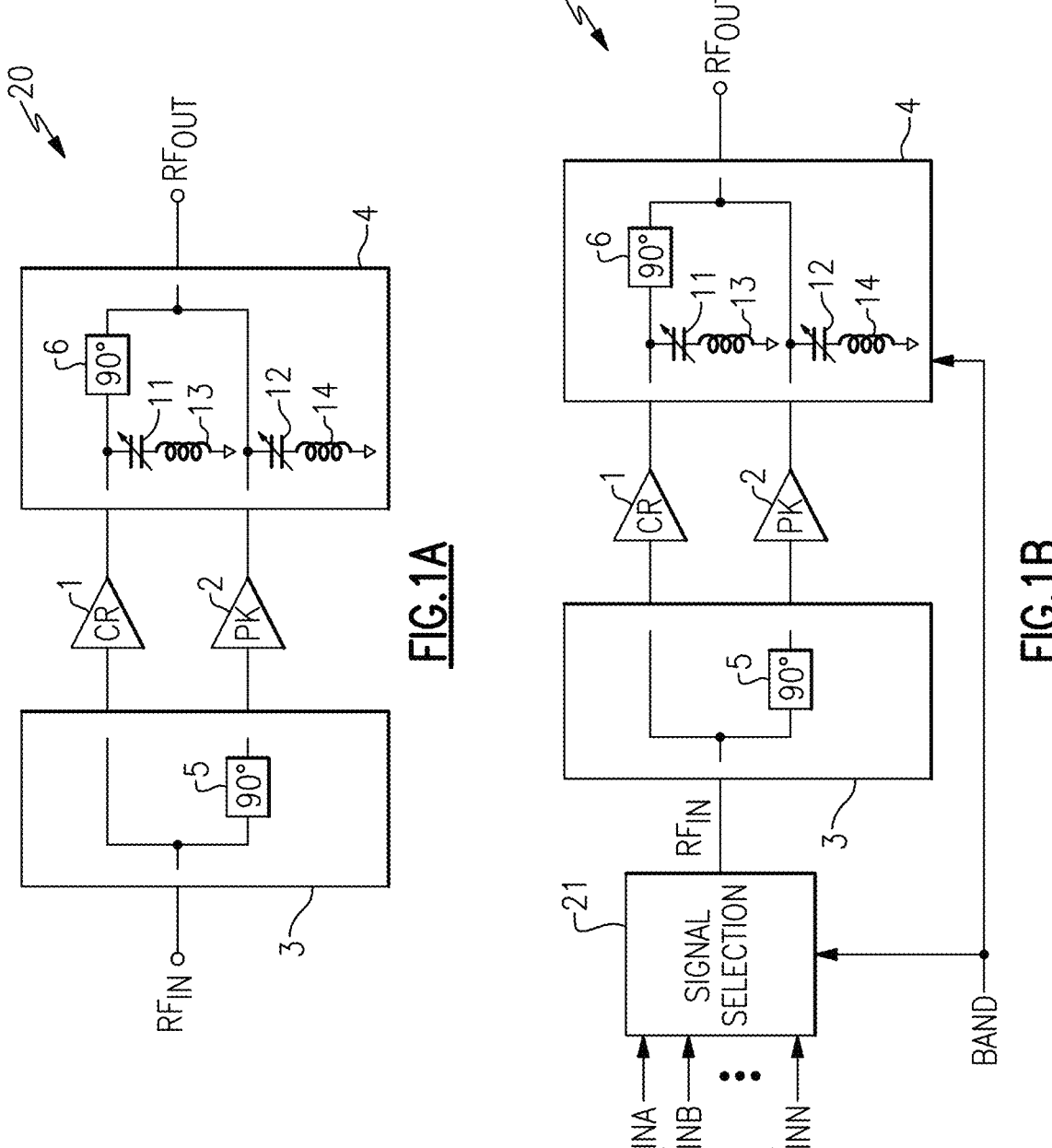
FIG. 1A is a schematic diagram of one embodiment of a Doherty power amplifier.
FIG. 1B is a schematic diagram of another embodiment of a Doherty power amplifier.

The following detailed description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

The linearity of a power amplifier is directly related to a level of gain compression within the power amplifier. Thus, a power amplifier can be designed for a fixed supply voltage that defines the target load impedance for acceptable linearity.

In certain applications, such as mobile handsets, operating environment leads to a relatively large variation in the load presented to a power amplifier. For example, a voltage standing wave ratio (VSWR) of an antenna and thus the power amplifier's load can vary based on a user's handling of the mobile handset. The load variation degrades power amplifier linearity and/or spectral performance.

One type of power amplifier is a Doherty power amplifier, which includes a main or carrier amplifier and an auxiliary or peaking amplifier that operate in combination with one another to amplify an RF signal. The Doherty power amplifier combines a carrier signal from the carrier amplifier and a peaking signal from the peaking amplifier to generate an amplified RF output signal. In certain implementations, the carrier amplifier is enabled over a wide range of power levels (for instance, by a class AB bias circuit) while the peaking amplifier is selectively enabled (for instance, by a class C bias circuit) at high power levels.

Doherty power amplifiers with a controllable capacitor are disclosed. In certain embodiments, a Doherty power amplifier includes a carrier amplifier that amplifies a first RF input signal, a peaking amplifier that amplifies a second RF input signal, and a combiner having a first input coupled to an output of the carrier amplifier, a second input coupled to an output of the peaking amplifier, and an output that provides a combined RF output signal. The combiner includes an inverter for providing impedance inversion between the first input and the output of the combiner, and a first controllable capacitor and a first inductor in series and operable to provide harmonic termination to the output of the carrier amplifier. A capacitance of the first controllable capacitor is controllable to tune both the inverter and the harmonic termination of the carrier amplifier.

In certain implementations, the combiner further includes a second controllable capacitor and a second inductor in series and operable to provide harmonic termination to the output of the peaking amplifier. Additionally, the first controllable capacitor and the first inductor form a first shunt inductor-capacitor (LC) network between the output of the carrier amplifier and ground, and the second controllable capacitor and the second inductor form a second shunt LC network between the output of the peaking amplifier and ground. In certain implementations, the first LC network, the inverter, and the second LC network are connected in a pi-configuration (also referred to herein as a J-configuration) in which the inverter is connected between the first shunt LC network and the second shunt LC network.

By controlling harmonic termination the controllable capacitor(s), the class of operation of the carrier and peaking amplifiers can be enhanced. For example, the class of operation of the Doherty power amplifier can be Class F, Class E, Class J, or Class inverse-F based on the harmonic termination presented to at the outputs of the power amplifiers. By controlling the values of the capacitor(s), harmonic termination is enabled with high efficiency over a wide bandwidth, which can be chosen based on a desired frequency bands (for example, for desired 4G/LTE and/or 5G bands).

In certain implementations, the inverter includes a quarter-wave transformer that connects the output of the carrier amplifier to the output of the peaking amplifier. For example, the quarter wave transformer can emulate a quarter wave transformer at center frequency, since it provides a phase shift of about 90 degrees (for example, 90 degrees+/−about 10%) and fixed characteristic impedance. By changing the values of the controllable capacitor(s) (for instance, by using switching to change capacitance value), the phase shift of the inverter is tuned to be closer to a desired 90 degree phase shift.

Accordingly, both harmonic termination and the inverter are tuned by the controllable capacitor(s). In certain implementations, the controllable capacitor(s) are implemented as switched capacitor networks.

The Doherty power amplifiers can be included in a wide variety of RF communication systems, including, but not limited to, base stations, network access points, mobile phones, tablets, customer-premises equipment (CPE), laptops, computers, wearable electronics, and/or other communication devices.

FIG. 1A is a schematic diagram of one embodiment of a Doherty power amplifier 20. The Doherty power amplifier 20 includes a carrier amplifier 1, a peaking amplifier 2, an input splitter 3, and an output combiner 4. The Doherty power amplifier 20 receives an RF transmit signal from an input terminal $RF_{IN}$, and outputs an RF output signal to the output terminal $RF_{OUT}$.

The input splitter 3 splits the RF transmit signal into a first RF input signal for the carrier amplifier 1 and a second RF input signal for the peaking amplifier 2. The input splitter 3 includes an inverter 5 for providing an impedance inversion. In this example, the inverter 5 is implemented as a quarter wave transformer that provides a phase shift of about 90 degrees at the carrier frequency of the RF transmit signal.

In the illustrated embodiment, the output combiner 4 includes a first input that is connected to an output of the carrier amplifier 1, a second input that is connected to an output of the peaking amplifier 2, and an output that provides the RF output signal to the output terminal $RF_{OUT}$.

The output combiner 4 includes an inverter 6 for providing an impedance inversion between the first input of the combiner 4 and the output of the combiner 4. In this example, the inverter 6 is implemented as a quarter wave transformer that provides a phase shift of about 90 degrees at the carrier frequency of the RF transmit signal/first RF input signal.

As shown in FIG. 1A, the output combiner 4 further includes a first controllable capacitor 11, a first inductor 13, a second controllable capacitor 12, and a second inductor 14. The first controllable capacitor 11 and the first inductor 13 are in series and provide harmonic termination to the output of the carrier amplifier 1. Additionally, the second controllable capacitor 12 and the second inductor 14 are in series and provide harmonic termination to the output of the peaking amplifier 2.

The first controllable capacitor 11 has a capacitance that is controllable to tune both inverter 6 and the harmonic termination provided to the output of the carrier amplifier 1. The second controllable capacitor 12 also has a capacitance that is controllable to aid in providing such an adjustment. The capacitance of the first controllable capacitor 11 and the capacitance of the second controllable capacitor 12 can have the same or different values.

In certain embodiments, the capacitance value(s) are tuned to provide harmonic termination at a second harmonic frequency of the RF transmit signal/first RF input signal.

As shown in FIG. 1A, the first controllable capacitor 11 and the first inductor 13 are connected in series to form a first inductor-capacitor (LC) network that is connected between the output of the carrier amplifier 1 and a ground voltage. Additionally, the second controllable capacitor 12 and the second inductor 14 are connected in series to form a second LC network that is connected between the output of the peaking amplifier 2 and the ground voltage. Furthermore, the inverter 6 is connected between the output of the carrier amplifier 1 and the output of the peaking amplifier 2 to form a pi-configuration.

FIG. 1B is a schematic diagram of another embodiment of a Doherty power amplifier 30. The Doherty power amplifier 30 includes a carrier amplifier 1, a peaking amplifier 2, an input splitter 3, an output combiner 4, and a signal selection circuit 21.

The Doherty power amplifier 30 of FIG. 1B is similar to the Doherty power amplifier 20 of FIG. 1A, except that the Doherty power amplifier 30 of FIG. 1B further includes the signal selection circuit 21. As shown in FIG. 1B, the signal selection circuit 11 selects the RF transmit signal provided to the input splitter 3 from amongst various RF transmit signals $RF_{INA}$, $RF_{INB}$, . . . $RF_{INN}$ associated with different frequency bands. In one example, the frequency bands include Band 2, Band 4, Band 25, and/or Band 26.

With continuing reference to FIG. 1B, a band signal BAND is used to determine which of the RF transmit signals $RF_{INA}$, $RF_{INB}$, . . . $RF_{INN}$ is selected and provided to the input splitter 3. Additionally, the band signal BAND is also used to control the capacitance of the first controllable capacitor 11 and/or the capacitance of the second controllable capacitor 12. Accordingly, as the frequency band of operation of the Doherty power amplifier 30 is changed, the capacitance(s) of the output combiner 4 are changed to accommodate the frequency of operation.

By controlling the values of the capacitors, harmonic termination is enabled with high efficiency over a wide bandwidth. In certain implementations, the capacitance values are chosen based on one or more desired frequency bands (for example, for desired 4G/LTE and/or 5G bands).

Figure 2:
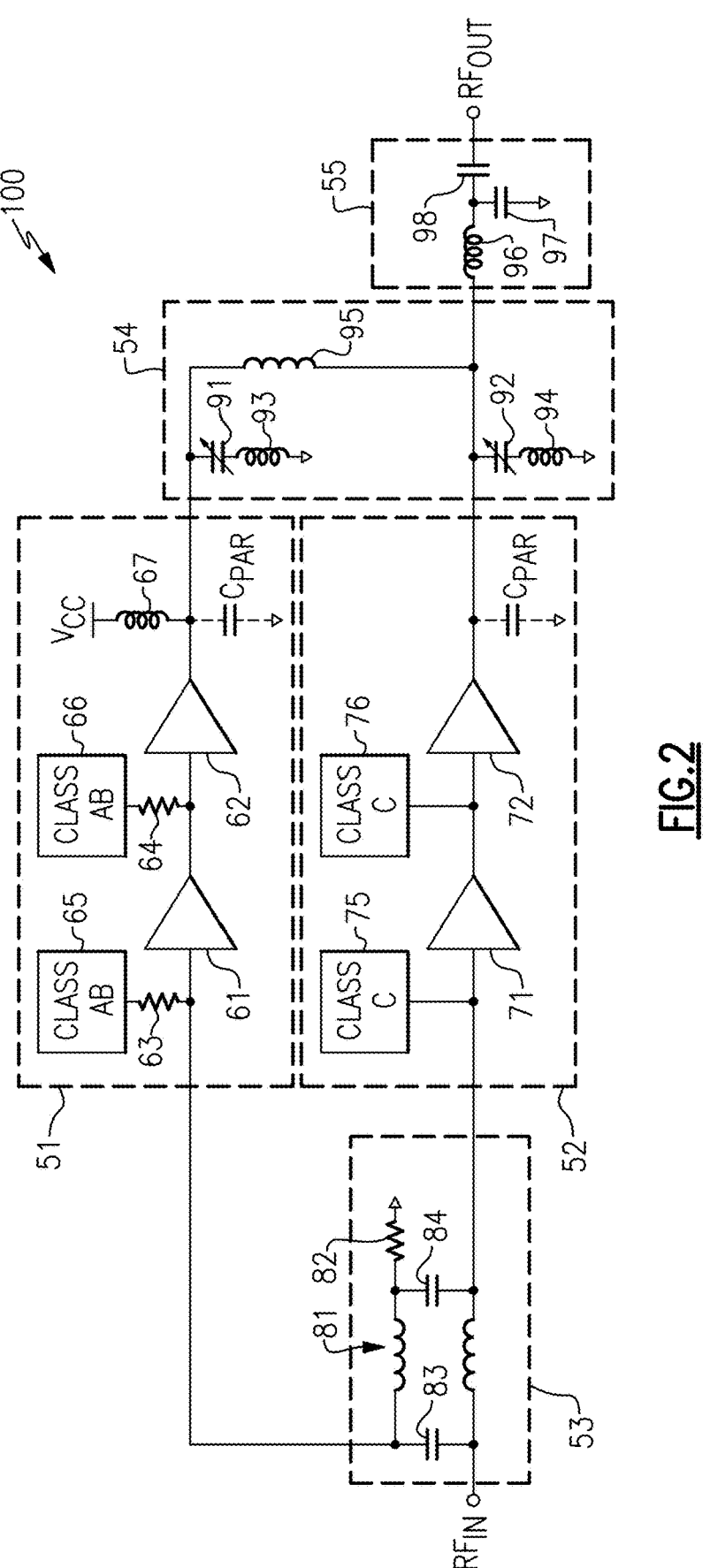
FIG. 2 is a schematic diagram of another embodiment of a Doherty power amplifier.

FIG. 2 is a schematic diagram of another embodiment of a Doherty power amplifier 100. The Doherty power amplifier 100 includes a carrier amplifier 51, a peaking amplifier 52, an input splitter 53, an output combiner 54, and an output matching network 55. The Doherty power amplifier 100 receives an RF transmit signal from an input terminal $RF_{IN}$, and outputs an RF output signal to the output terminal $RF_{OUT}$.

The input splitter 54 includes a balun 81, a termination resistor 82, a first capacitor 83, and a second capacitor 84. The balun 81 includes a primary winding or section connected between the input terminal $RF_{IN}$ and an input of the peaking amplifier 52. Additionally, the balun 81 includes a secondary winding or section that is connected between the input of the carrier amplifier 51 and a termination node. The primary winding and the secondary winding of the balun 81 are electromagnetically coupled to one another. The termination resistor 82 is connected between the termination node and ground. Furthermore, the first capacitor 83 is connected between the input terminal $RF_{IN}$ and the input of the carrier amplifier 51, while the second capacitor 84 is connected between the input of the peaking amplifier 52 and the termination node.

With continuing reference to FIG. 2, the carrier amplifier 51 includes an input stage 61, an output stage 62, an input stage bias resistor 63, an output stage bias resistor 64, an input stage class AB bias circuit 65, an output stage class AB bias circuit 66, and a choke inductor 67 that receives a power supply voltage $V_{CC}$. Additionally, the peaking amplifier 52 includes an input stage 71, an output stage 72, an input stage class C bias circuit 75, and an output stage class C bias circuit 76. An output parasitic capacitance $C_{PAR}$ of the carrier amplifier 51 and of the peaking amplifier 52 is depicted in FIG. 2. Although two stage carrier and peaking amplifiers are depicted, more or fewer stages can be included in an amplifier.

In the illustrated embodiment, the output combiner 54 includes a first input that is connected to an output of the carrier amplifier 51, a second input that is connected to an output of the peaking amplifier 52, and an output that provides the RF output signal to the output terminal $RF_{OUT}$ through the output matching network 55.

The output combiner 54 includes a first controllable capacitor 91, a first inductor 93, a second controllable capacitor 92, a second inductor 94, and an impedance inverting inductor 95. The first controllable capacitor 91 and the first inductor 93 are in series and provide harmonic termination to the output of the carrier amplifier 51. Additionally, the second controllable capacitor 92 and the second inductor 94 are in series and provide harmonic termination to the output of the peaking amplifier 52.

In one embodiment, the capacitance values of the first controllable capacitor 91 and the second controllable capacitor 92 are chosen to achieve a 90 degree phase shift of the impedance inverting inductor 95 while also achieving harmonic termination at the outputs of the carrier amplifier 51 and the peaking amplifier 52. In certain implementations, the impedance inverting inductor 95 resonates with the output parasitic capacitance $C_{PAR}$ such that parasitic capacitance is resonated out and performance is enhanced.

Figure 3:
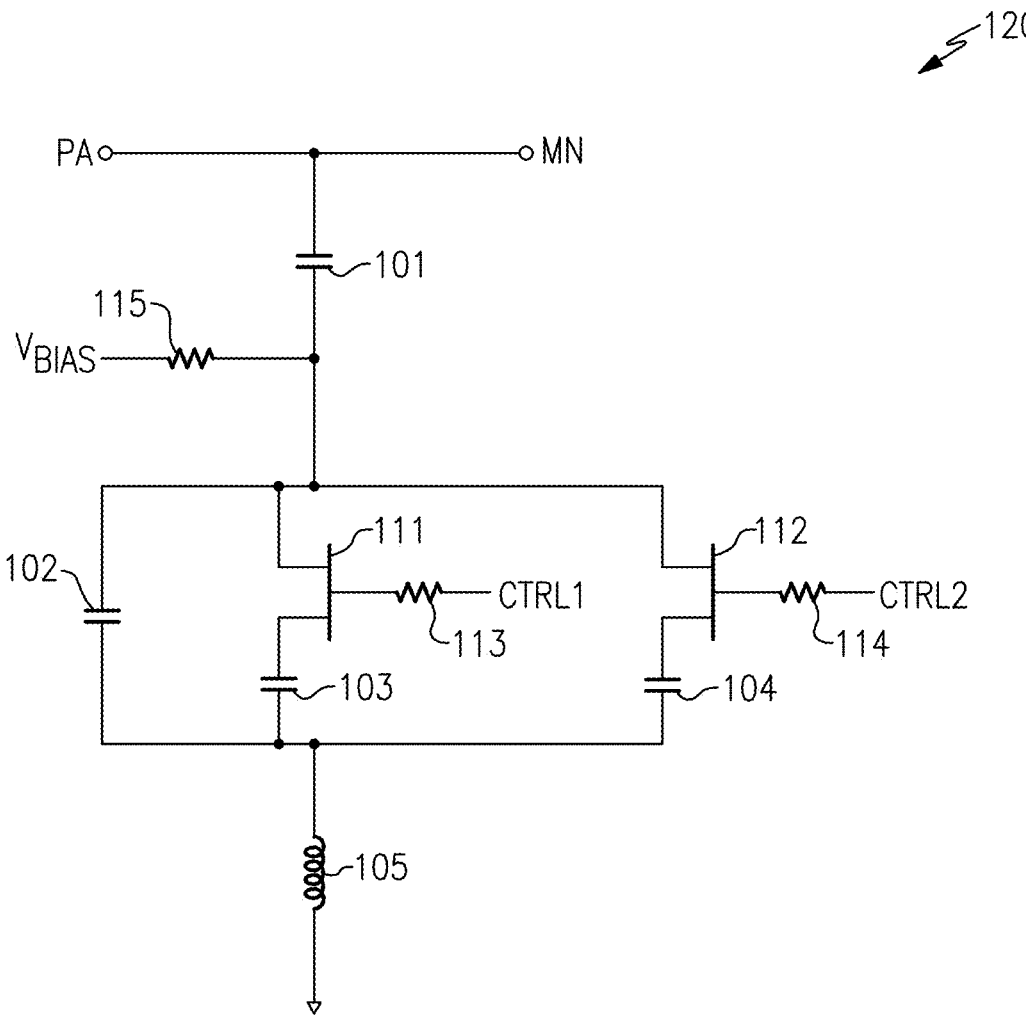
FIG. 3 is a schematic diagram of one embodiment of a controllable series inductor-capacitor network for a Doherty power amplifier.

FIG. 3 is a schematic diagram of one embodiment of a controllable series LC network 120 for a Doherty power amplifier.

The controllable series LC network 120 is connected in shunt to an RF signal path between a power amplifier terminal PA and an output matching network terminal MN. For example, the controllable series LC network 120 can be connected between the output of a carrier amplifier and ground, or between the output of a peaking amplifier and ground. In some implementations, two instantiations of the controllable series LC network 120 can be included in a Doherty power amplifier (one for the output of the peaking amplifier and another for the output of the carrier amplifier).

As shown in FIG. 3, the controllable series LC network 120 includes a DC blocking capacitor 101, a fixed capacitor 102, a first switchable capacitor 103, a second switchable capacitor 104, an inductor 105, a first field-effect transistor (FET) switch 111, a second FET switch 112, a first gate resistor 113, a second gate resistor 114, and a bias resistor 115 for receiving a bias voltage $V_{BIAS}$.

In the illustrated embodiment, the controllable series LC network 120 includes a controllable capacitor implemented using a plurality of circuit branches that are connected in parallel. The plurality of circuit branches includes a first circuit branch with the fixed capacitor 102, a second circuit branch with the series combination of the first FET switch 111 and the first switchable capacitor 103, and a third circuit branch with the series combination of the second FET switch 112 and the second switchable capacitor 104.

The first FET switch 111 has a gate controlled by a first control signal CTRL1, while the second FET switch 112 has a gate controlled by a second control signal CTRL2. In certain implementations, the FET switches are pseudomorphic high electron mobility transistors (pHEMTs). When both the first control signal CTRL1 and the second control signal CTRL2 are turned off, the controllable capacitor has a capacitance about equal to that of the fixed capacitor 102. However, by turning on the first FET switch 111 and/or the second FET switch 112 the capacitance of the controllable capacitor can be selectively increased by the capacitance values of the first switchable capacitor 103 and the second switchable capacitor 104, respectively.

Figure 4:
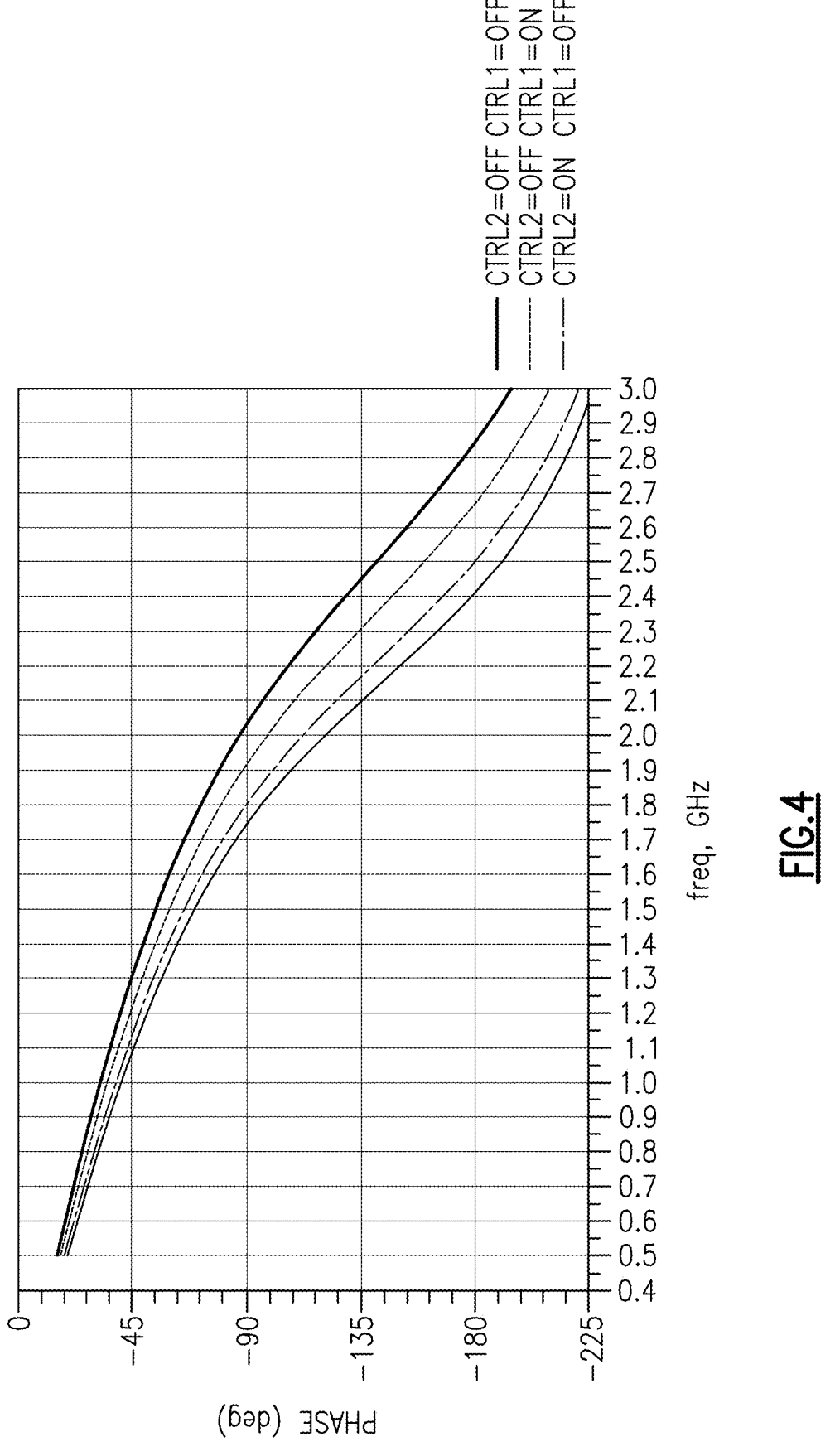
FIG. 4 is one example of a graph of inverter phase versus frequency for a Doherty power amplifier.

FIG. 4 is one example of a graph of inverter phase versus frequency for a Doherty power amplifier. The graph includes plots of inverter phase versus frequency for one implementation of the Doherty power amplifier 100 of FIG. 2 using the controllable series LC network 120 of FIG. 3 to provide controllable capacitance. The plots are shown for four different capacitance values achieved by different settings of the control signals CTRL1/CTRL2.

As shown in FIG. 4, the inverter's 90 degree point changes with the switched capacitor state, thereby providing a mechanism to tune the inverter.

Figure 5:
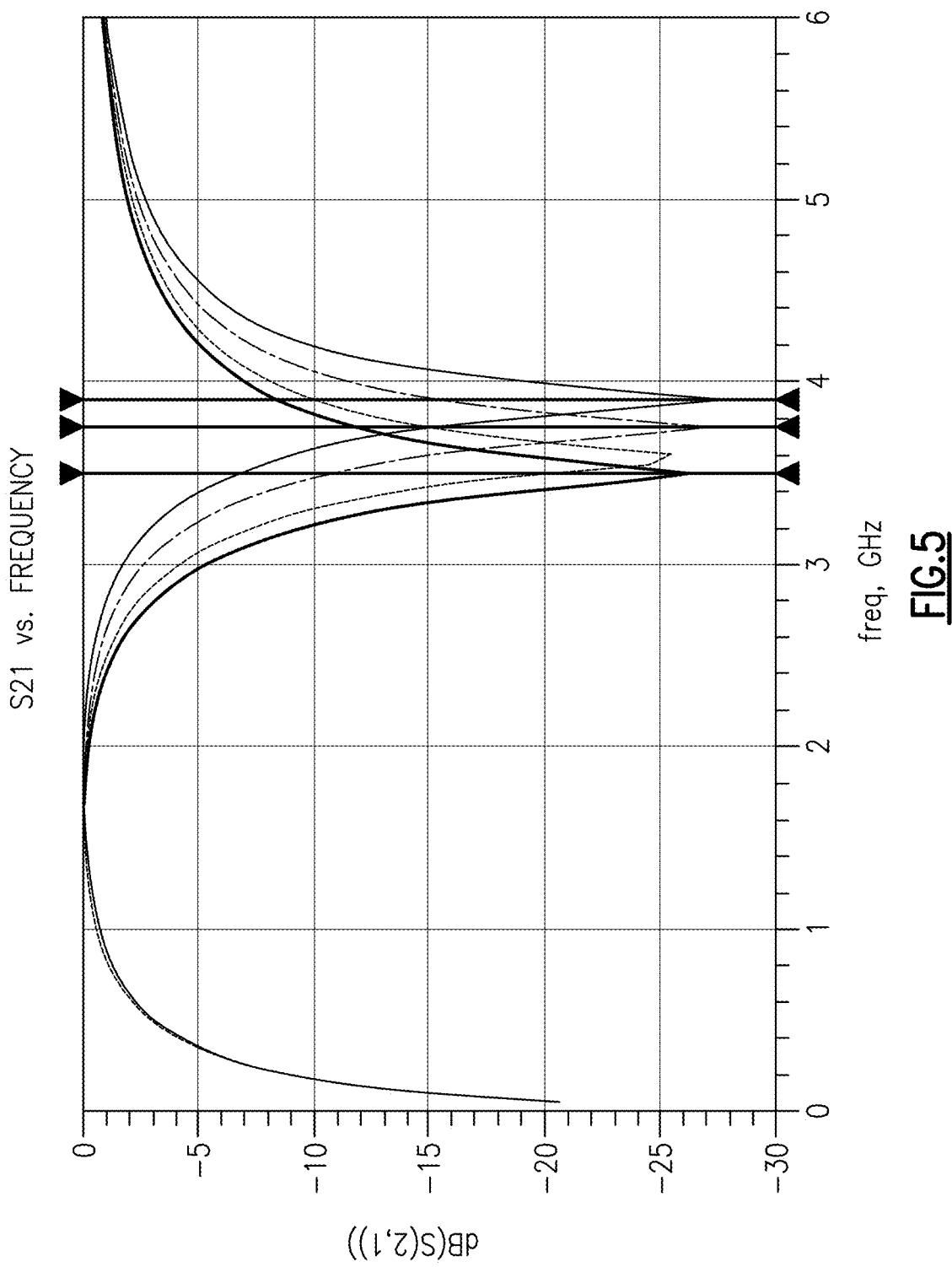
FIG. 5 is one example of a graph of S21 versus frequency for a Doherty power amplifier.

FIG. 5 is one example of a graph of S21 versus frequency for a Doherty power amplifier. The graph includes plots of inverter phase versus frequency for one implementation of the Doherty power amplifier 100 of FIG. 2 using the controllable series LC network 120 of FIG. 3 to provide controllable capacitance. The plots are shown for four different capacitance values.

As shown in FIG. 5, harmonic termination changes with the switched capacitor state, thereby providing a mechanism to tune harmonic termination.

Figure 6B:
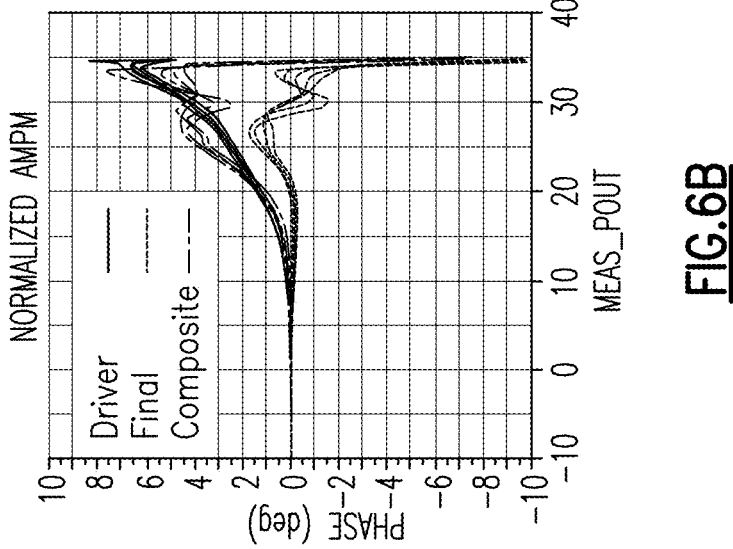
FIG. 6B is one example of a graph of phase distortion versus frequency for a Doherty power amplifier.
Figure 6A:
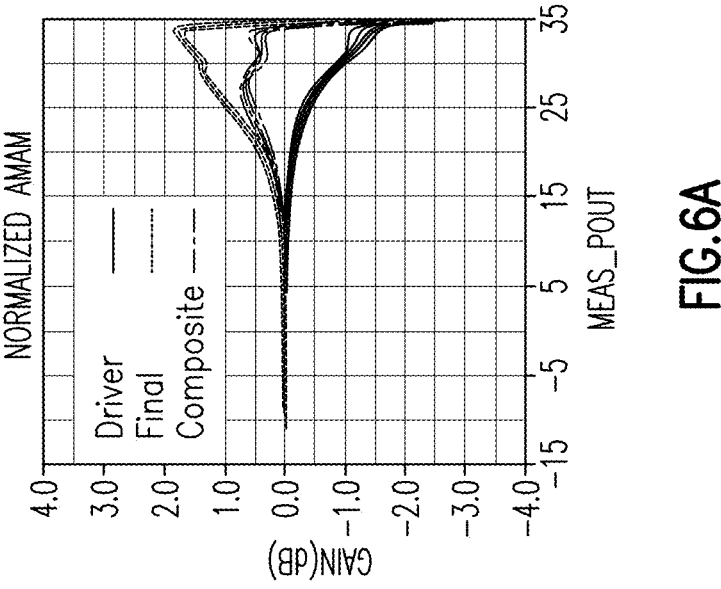
FIG. 6A is one example of a graph of amplitude distortion versus frequency for a Doherty power amplifier.

FIG. 6A is one example of a graph of amplitude distortion versus frequency for a Doherty power amplifier.

FIG. 6B is one example of a graph of phase distortion versus frequency for a Doherty power amplifier.

Figure 7B:
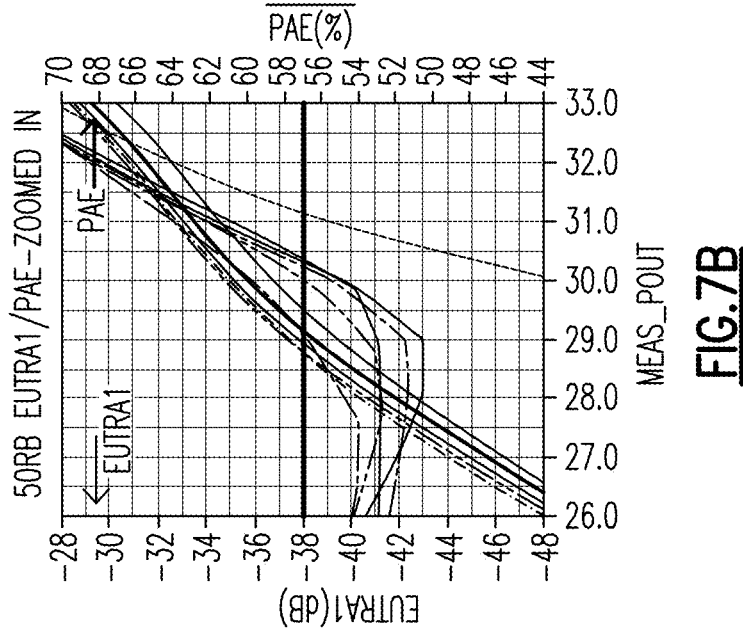
FIG. 7B is one example of a graph of power added efficiency (PAE) versus output power for a Doherty power amplifier.
Figure 7A:
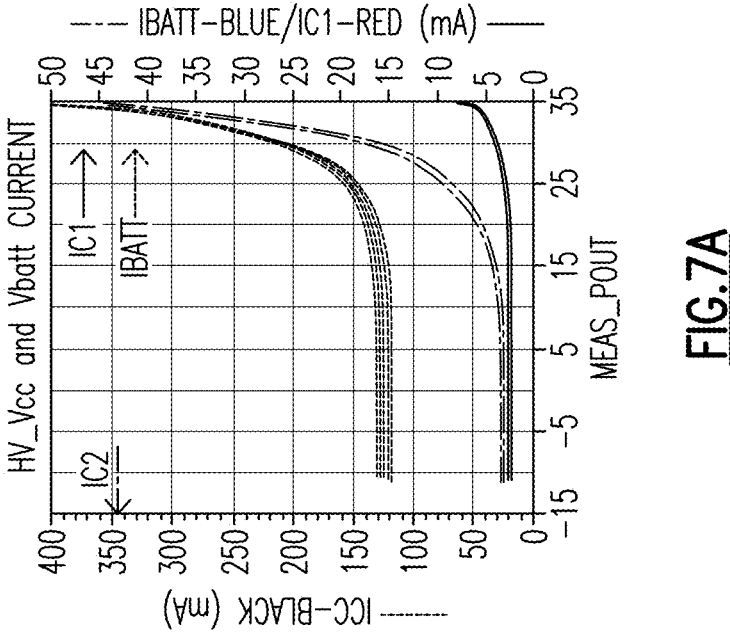
FIG. 7A is one example of a graph of battery and power amplifier currents versus output power for a Doherty power amplifier.

FIG. 7A is one example of a graph of battery and power amplifier currents versus output power for a Doherty power amplifier.

FIG. 7B is one example of a graph of power added efficiency (PAE) versus output power for a Doherty power amplifier.

With reference to FIGS. 6A to 7B, example graphs are shown for one implementation of the Doherty power amplifier 100 of FIG. 2 using the controllable series LC network 120 of FIG. 3 to provide controllable capacitance. Performance is depicted at 1750 MHz.

Figure 8B:
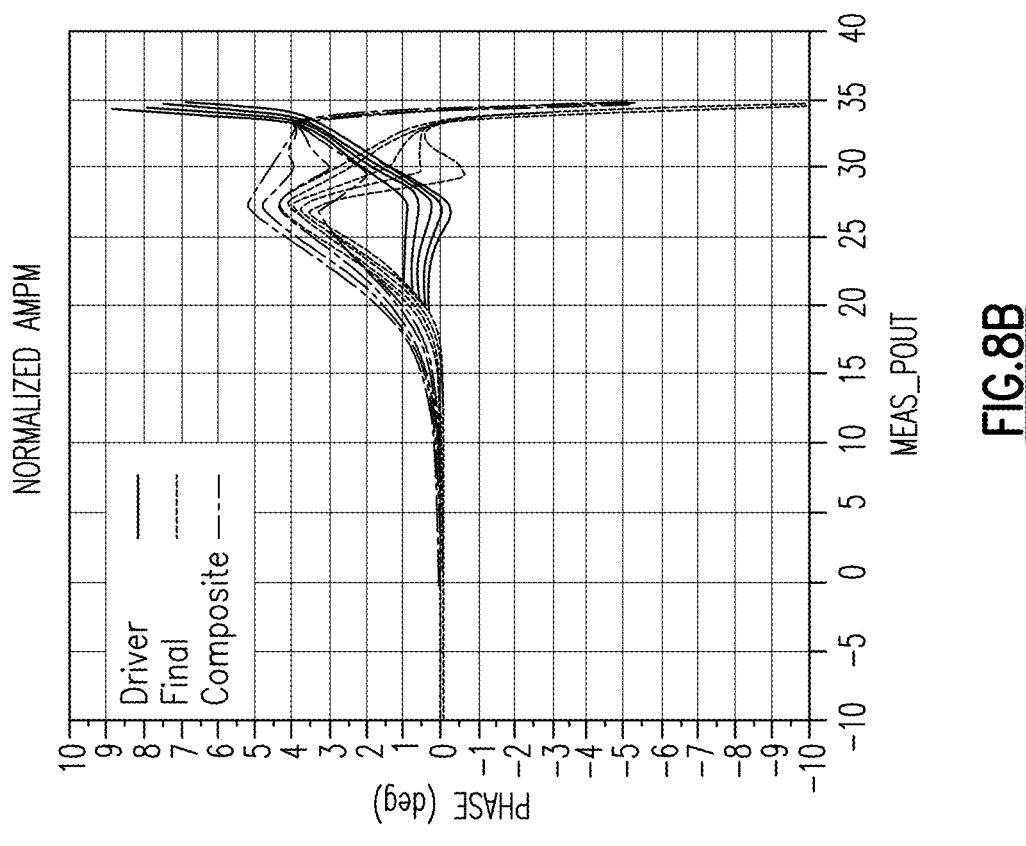
FIG. 8B is another example of a graph of phase distortion versus frequency for a Doherty power amplifier.
Figure 8A:
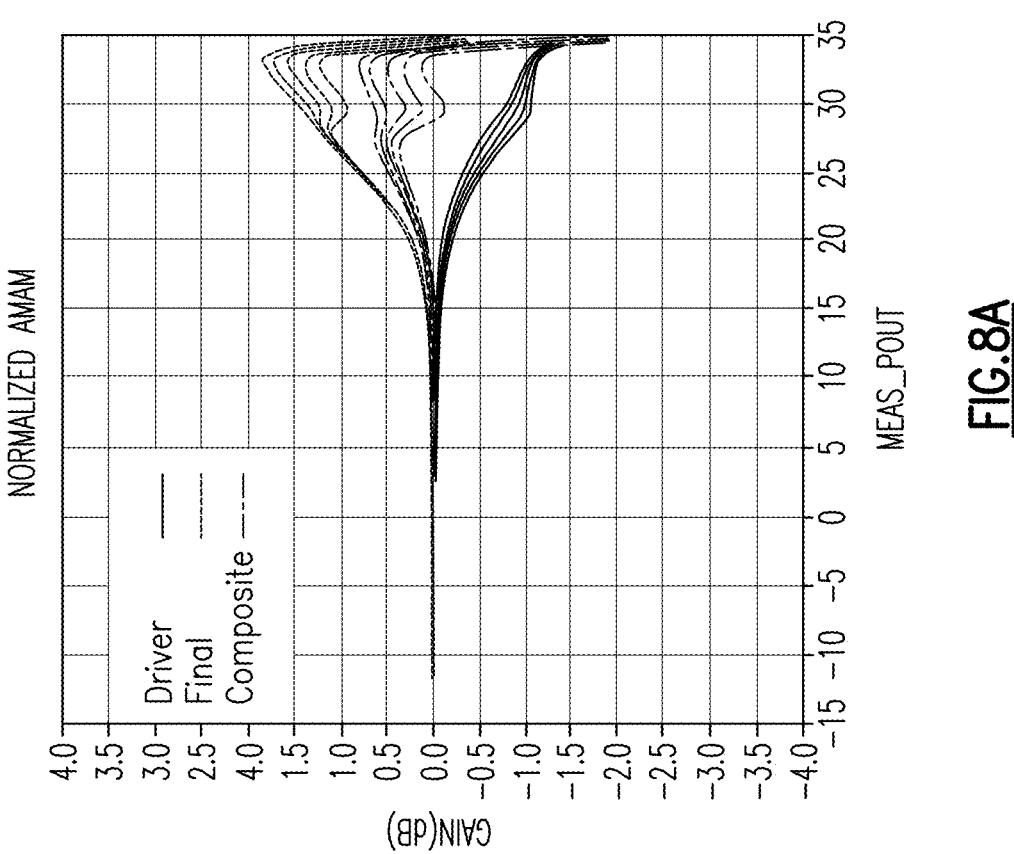
FIG. 8A is another example of a graph of amplitude distortion versus frequency for a Doherty power amplifier.

FIG. 8A is another example of a graph of amplitude distortion versus frequency for a Doherty power amplifier.

FIG. 8B is another example of a graph of phase distortion versus frequency for a Doherty power amplifier.

Figure 9B:
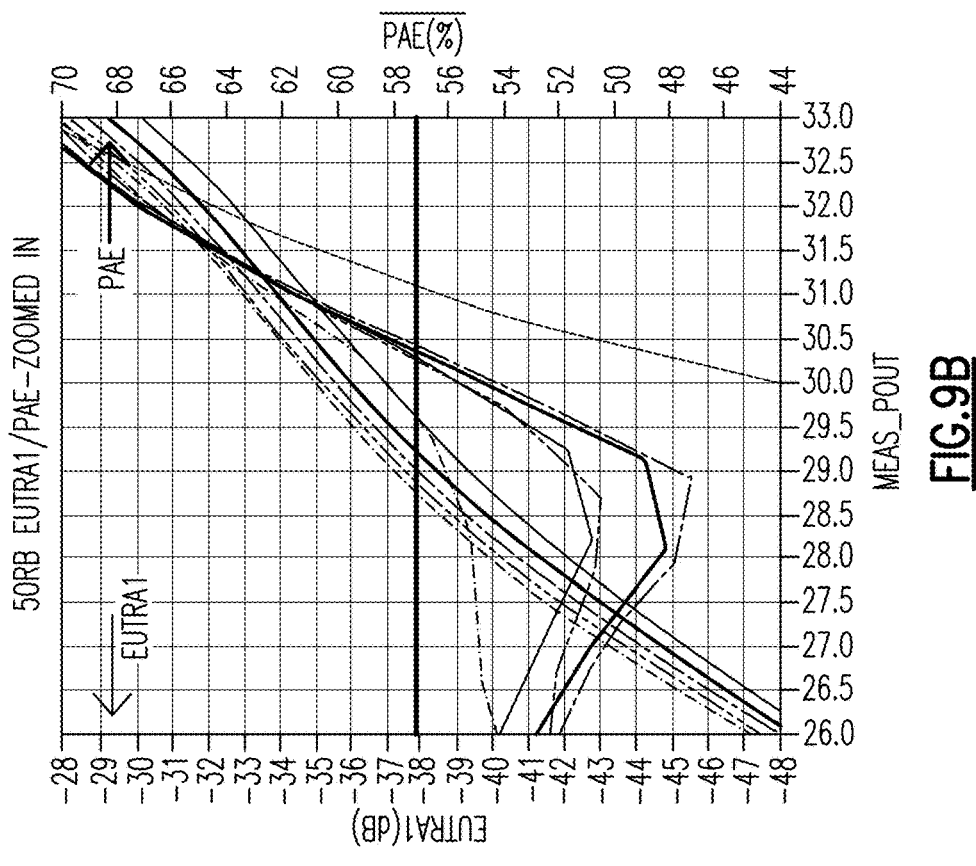
FIG. 9B is another example of a graph of PAE versus output power for a Doherty power amplifier.
Figure 9A:
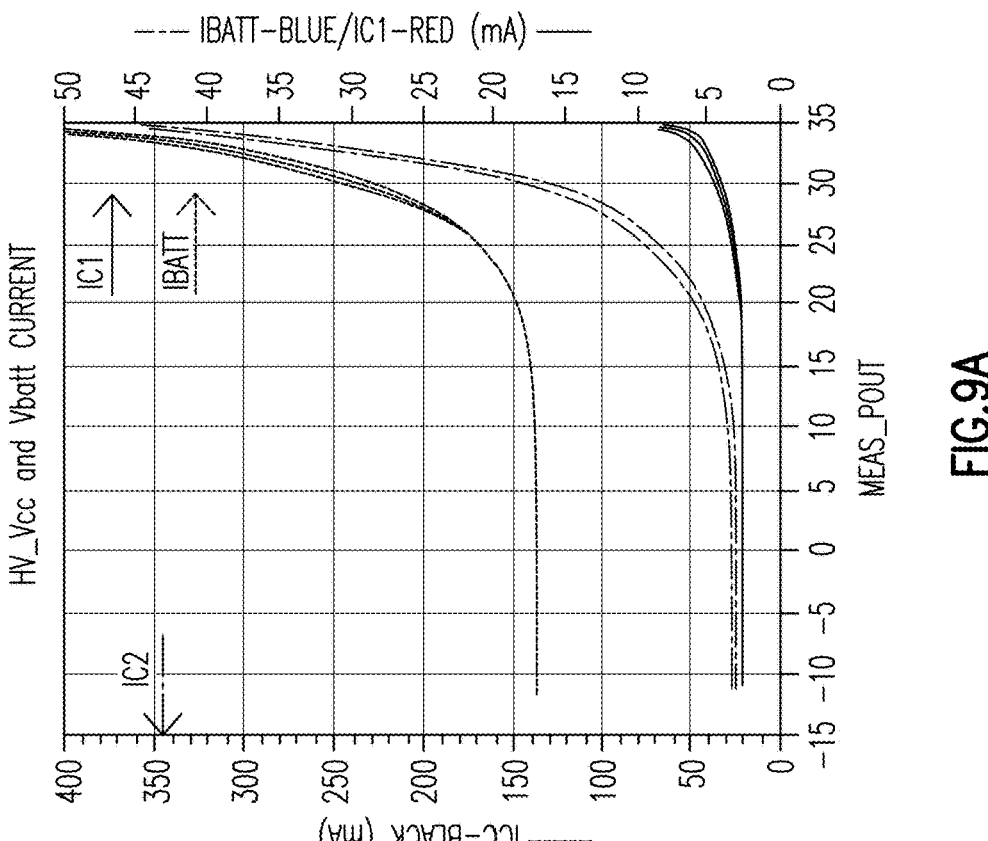
FIG. 9A is another example of a graph of battery and power amplifier currents versus output power for a Doherty power amplifier.

FIG. 9A is another example of a graph of battery and power amplifier currents versus output power for a Doherty power amplifier.

FIG. 9B is another example of a graph of PAE versus output power for a Doherty power amplifier.

With reference to FIGS. 8A to 9B, example graphs are shown for one implementation of the Doherty power amplifier 100 of FIG. 2 using the controllable series LC network 120 of FIG. 3 to provide controllable capacitance. Performance is depicted at 1950 MHz.

Although FIGS. 5-9B depict examples of performance results for a 1 Doherty power amplifier, other performance results are possible. For example, performance results of a Doherty power amplifier can depend on a variety of factors including, but not limited to, amplifier implementation, operating conditions, frequency range, and/or simulation/measurement environment.

Figure 10:
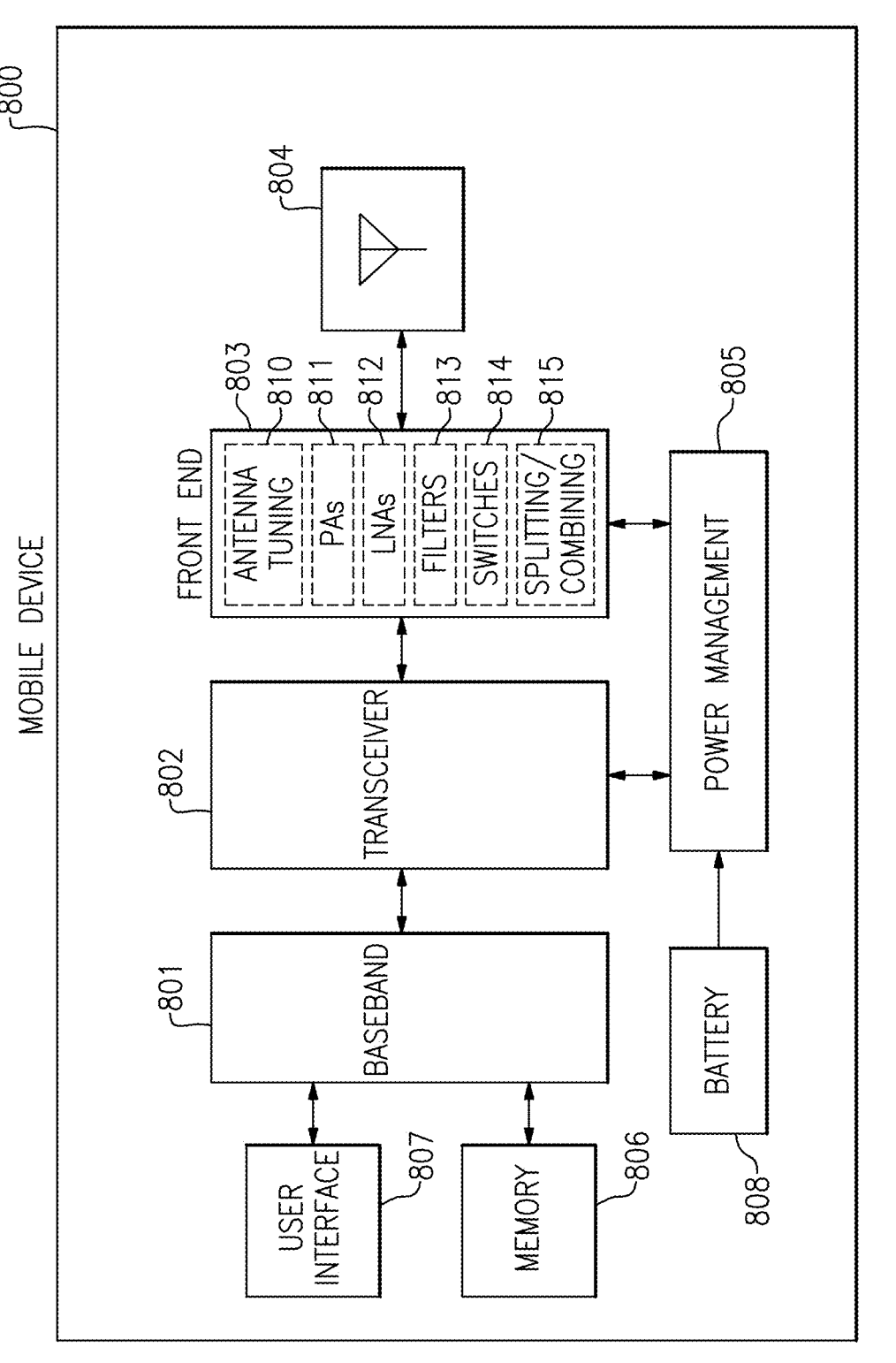
FIG. 10 is a schematic diagram of one embodiment of a mobile device.

FIG. 10 is a schematic diagram of one embodiment of a mobile device 800. The mobile device 800 includes a baseband system 801, a transceiver 802, a front end system 803, antennas 804, a power management system 805, a memory 806, a user interface 807, and a battery 808.

The mobile device 800 can be used communicate using a wide variety of communications technologies, including, but not limited to, 2G, 3G, 4G (including LTE, LTE-Advanced, and LTE-Advanced Pro), 5G NR, WLAN (for instance, WiFi), WPAN (for instance, Bluetooth and ZigBee), WMAN (for instance, WiMax), and/or GPS technologies.

The transceiver 802 generates RF signals for transmission and processes incoming RF signals received from the antennas 804. It will be understood that various functionalities associated with the transmission and receiving of RF signals can be achieved by one or more components that are collectively represented in FIG. 10 as the transceiver 802. In one example, separate components (for instance, separate circuits or dies) can be provided for handling certain types of RF signals.

The front end system 803 aids in conditioning signals transmitted to and/or received from the antennas 804. In the illustrated embodiment, the front end system 803 includes antenna tuning circuitry 810, power amplifiers (PAs) 811, low noise amplifiers (LNAs) 812, filters 813, switches 814, and signal splitting/combining circuitry 815. However, other implementations are possible.

For example, the front end system 803 can provide a number of functionalities, including, but not limited to, amplifying signals for transmission, amplifying received signals, filtering signals, switching between different bands, switching between different power modes, switching between transmission and receiving modes, duplexing of signals, multiplexing of signals (for instance, diplexing or triplexing), or some combination thereof.

At least one of the power amplifiers 811 is implemented as a Doherty power amplifier in accordance with the teachings herein. Although the mobile device 800 illustrates one embodiment of a communication system that can be implemented with one or more Doherty power amplifiers, the teachings herein are applicable to a wide range of systems. Accordingly, other implementations are possible.

In certain implementations, the mobile device 800 supports carrier aggregation, thereby providing flexibility to increase peak data rates. Carrier aggregation can be used for both Frequency Division Duplexing (FDD) and Time Division Duplexing (TDD), and may be used to aggregate a plurality of carriers or channels. Carrier aggregation includes contiguous aggregation, in which contiguous carriers within the same operating frequency band are aggregated. Carrier aggregation can also be non-contiguous and can include carriers separated in frequency within a common band or in different bands.

The antennas 804 can include antennas used for a wide variety of types of communications. For example, the antennas 804 can include antennas for transmitting and/or receiving signals associated with a wide variety of frequencies and communications standards.

In certain implementations, the antennas 804 support MIMO communications and/or switched diversity communications. For example, MIMO communications use multiple antennas for communicating multiple data streams over a single radio frequency channel. MIMO communications benefit from higher signal to noise ratio, improved coding, and/or reduced signal interference due to spatial multiplexing differences of the radio environment. Switched diversity refers to communications in which a particular antenna is selected for operation at a particular time. For example, a switch can be used to select a particular antenna from a group of antennas based on a variety of factors, such as an observed bit error rate and/or a signal strength indicator.

The mobile device 800 can operate with beamforming in certain implementations. For example, the front end system 803 can include amplifiers having controllable gain and phase shifters having controllable phase to provide beam formation and directivity for transmission and/or reception of signals using the antennas 804. For example, in the context of signal transmission, the amplitude and phases of the transmit signals provided to the antennas 804 are controlled such that radiated signals from the antennas 804 combine using constructive and destructive interference to generate an aggregate transmit signal exhibiting beam-like qualities with more signal strength propagating in a given direction. In the context of signal reception, the amplitude and phases are controlled such that more signal energy is received when the signal is arriving to the antennas 804 from a particular direction. In certain implementations, the antennas 804 include one or more arrays of antenna elements to enhance beamforming.

The baseband system 801 is coupled to the user interface 807 to facilitate processing of various user input and output (I/O), such as voice and data. The baseband system 801 provides the transceiver 802 with digital representations of transmit signals, which the transceiver 802 processes to generate RF signals for transmission. The baseband system 801 also processes digital representations of received signals provided by the transceiver 802. As shown in FIG. 10, the baseband system 801 is coupled to the memory 806 of facilitate operation of the mobile device 800.

The memory 806 can be used for a wide variety of purposes, such as storing data and/or instructions to facilitate the operation of the mobile device 800 and/or to provide storage of user information.

The power management system 805 provides a number of power management functions of the mobile device 800. In certain implementations, the power management system 805 includes a PA supply control circuit that controls the supply voltages of the power amplifiers 811. For example, the power management system 805 can be configured to change the supply voltage(s) provided to one or more of the power amplifiers 811 to improve efficiency, such as power added efficiency (PAE).

As shown in FIG. 10, the power management system 805 receives a battery voltage from the battery 808. The battery 808 can be any suitable battery for use in the mobile device 800, including, for example, a lithium-ion battery.

Figure 11:
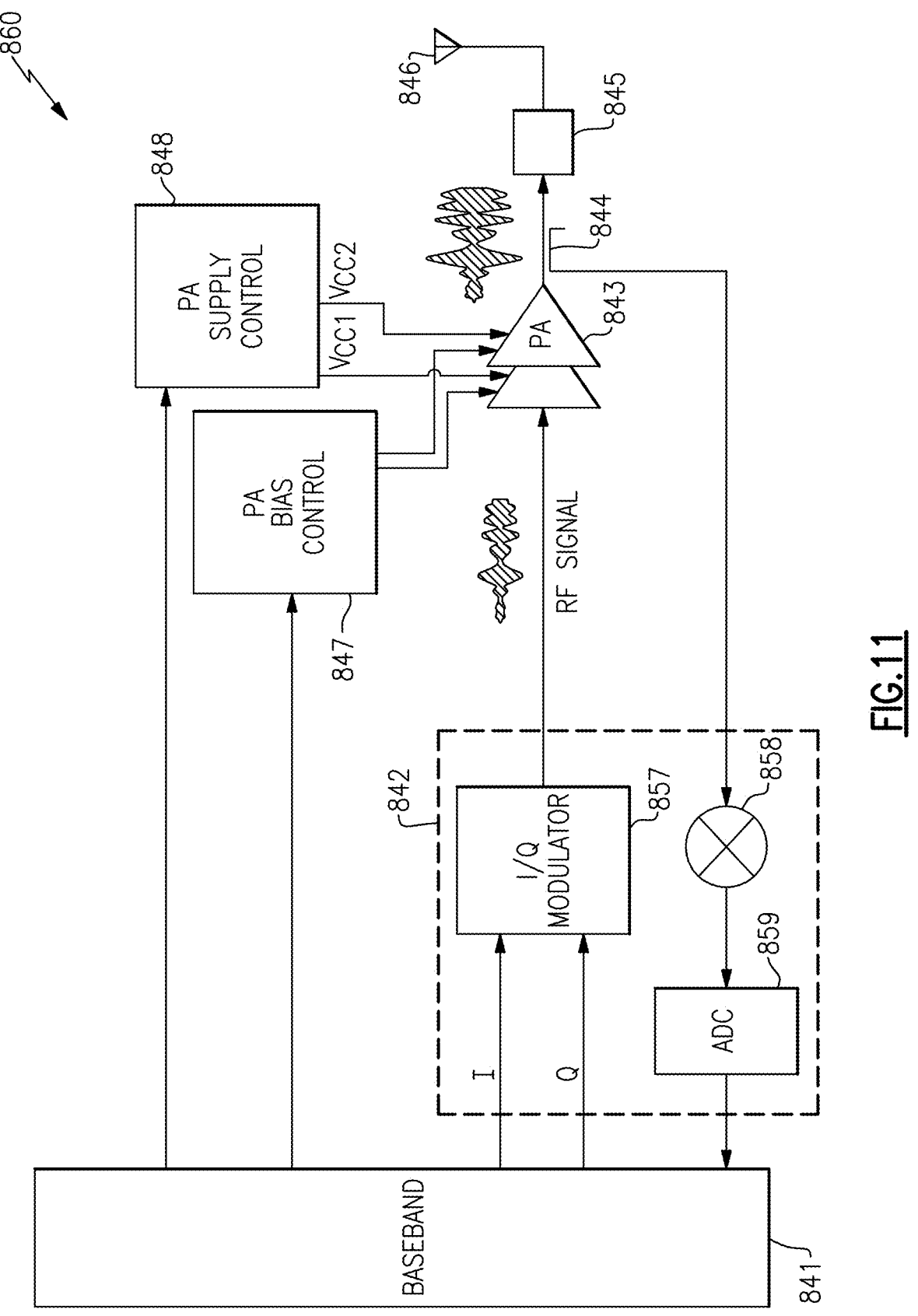
FIG. 11 is a schematic diagram of a power amplifier system according to another embodiment.

FIG. 11 is a schematic diagram of a power amplifier system 860 according to another embodiment. The illustrated power amplifier system 860 includes a baseband processor 841, a transmitter/observation receiver 842, a power amplifier (PA) 843, a directional coupler 844, front-end circuitry 845, an antenna 846, a PA bias control circuit 847, and a PA supply control circuit 848. The illustrated transmitter/observation receiver 842 includes an I/Q modulator 857, a mixer 858, and an analog-to-digital converter (ADC) 859. In certain implementations, the transmitter/observation receiver 842 is incorporated into a transceiver.

The baseband processor 841 can be used to generate an in-phase (I) signal and a quadrature-phase (Q) signal, which can be used to represent a sinusoidal wave or signal of a desired amplitude, frequency, and phase. For example, the I signal can be used to represent an in-phase component of the sinusoidal wave and the Q signal can be used to represent a quadrature-phase component of the sinusoidal wave, which can be an equivalent representation of the sinusoidal wave. In certain implementations, the I and Q signals can be provided to the I/Q modulator 857 in a digital format. The baseband processor 841 can be any suitable processor configured to process a baseband signal. For instance, the baseband processor 841 can include a digital signal processor, a microprocessor, a programmable core, or any combination thereof. Moreover, in some implementations, two or more baseband processors 821 can be included in the power amplifier system 860.

The I/Q modulator 857 can be configured to receive the I and Q signals from the baseband processor 821 and to process the I and Q signals to generate an RF signal. For example, the I/Q modulator 857 can include digital-to-analog converters (DACs) configured to convert the I and Q signals into an analog format, mixers for upconverting the I and Q signals to RF, and a signal combiner for combining the upconverted I and Q signals into an RF signal suitable for amplification by the power amplifier 843. In certain implementations, the I/Q modulator 857 can include one or more filters configured to filter frequency content of signals processed therein.

The power amplifier 843 can receive the RF signal from the I/Q modulator 857, and when enabled can provide an amplified RF signal to the antenna 846 via the front-end circuitry 845. The power amplifier 843 can be implemented in accordance with any of the embodiments herein.

The front-end circuitry 845 can be implemented in a wide variety of ways. In one example, the front-end circuitry 845 includes one or more switches, filters, duplexers, multiplexers, and/or other components. In another example, the front-end circuitry 845 is omitted in favor of the power amplifier 843 providing the amplified RF signal directly to the antenna 846.

The directional coupler 844 senses an output signal of the power amplifier 823. Additionally, the sensed output signal from the directional coupler 844 is provided to the mixer 858, which multiplies the sensed output signal by a reference signal of a controlled frequency. The mixer 858 operates to generate a downshifted signal by downshifting the sensed output signal's frequency content. The downshifted signal can be provided to the ADC 859, which can convert the downshifted signal to a digital format suitable for processing by the baseband processor 841. Including a feedback path from the output of the power amplifier 843 to the baseband processor 841 can provide a number of advantages. For example, implementing the baseband processor 841 in this manner can aid in providing power control, compensating for transmitter impairments, and/or in performing digital pre-distortion (DPD). Although one example of a sensing path for a power amplifier is shown, other implementations are possible.

The PA supply control circuit 848 receives a power control signal from the baseband processor 841, and controls supply voltages of the power amplifier 843. In the illustrated configuration, the PA supply control circuit 848 generates a first supply voltage $V_{CC1}$ for powering an input stage of the power amplifier 843 and a second supply voltage $V_{CC2}$ for powering an output stage of the power amplifier 843. The PA supply control circuit 848 can control the voltage level of the first supply voltage $V_{CC1}$ and/or the second supply voltage $V_{CC2}$ to enhance the power amplifier system's PAE.

The PA supply control circuit 848 can employ various power management techniques to change the voltage level of one or more of the supply voltages over time to improve the power amplifier's power added efficiency (PAE), thereby reducing power dissipation.

One technique for improving efficiency of a power amplifier is average power tracking (APT), in which a DC-to-DC converter is used to generate a supply voltage for a power amplifier based on the power amplifier's average output power. Another technique for improving efficiency of a power amplifier is envelope tracking (ET), in which a supply voltage of the power amplifier is controlled in relation to the envelope of the RF signal. Thus, when a voltage level of the envelope of the RF signal increases the voltage level of the power amplifier's supply voltage can be increased. Likewise, when the voltage level of the envelope of the RF signal decreases the voltage level of the power amplifier's supply voltage can be decreased to reduce power consumption.

In certain configurations, the PA supply control circuit 848 is a multi-mode supply control circuit that can operate in multiple supply control modes including an APT mode and an ET mode. For example, the power control signal from the baseband processor 841 can instruct the PA supply control circuit 848 to operate in a particular supply control mode.

As shown in FIG. 11, the PA bias control circuit 847 receives a bias control signal from the baseband processor 841, and generates bias control signals for the power amplifier 843. In the illustrated configuration, the bias control circuit 847 generates bias control signals for both an input stage of the power amplifier 843 and an output stage of the power amplifier 843. However, other implementations are possible.

Figure 12A:
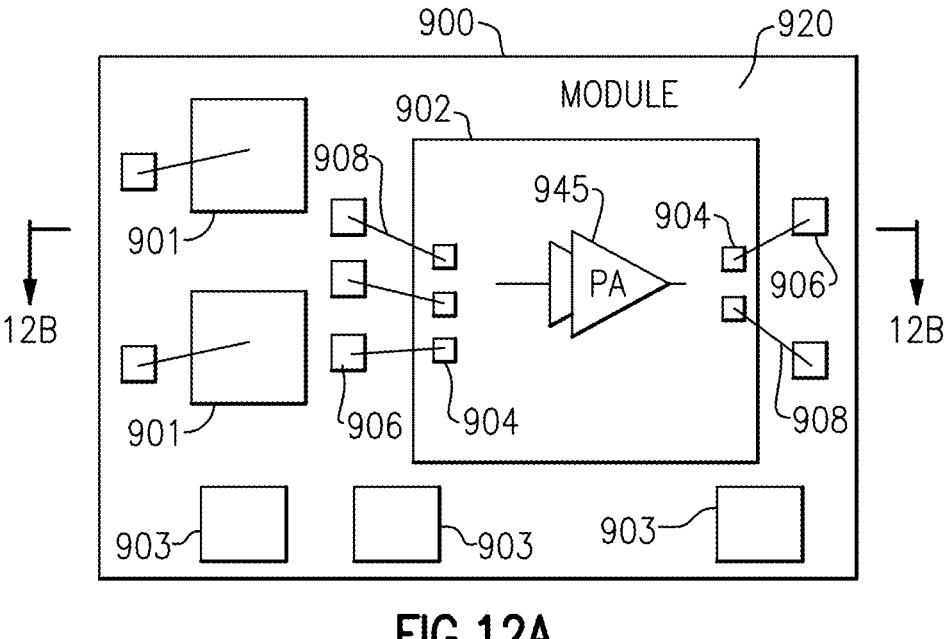
FIG. 12A is a schematic diagram of one embodiment of a packaged module.
Figure 12B:
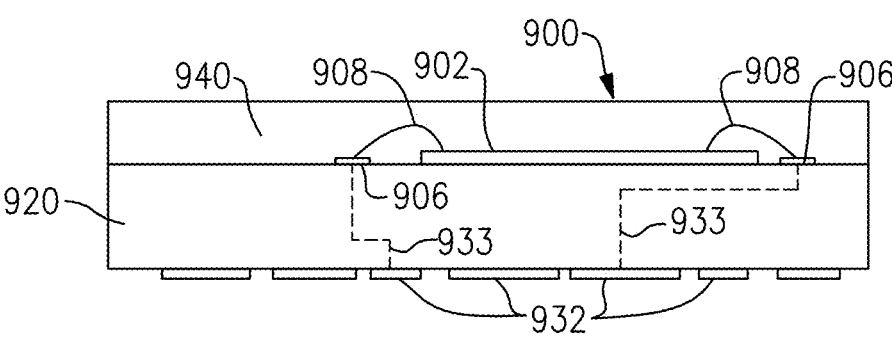
FIG. 12B is a schematic diagram of a cross-section of the packaged module of FIG. 12A taken along the lines 12B-12B.

FIG. 12A is a schematic diagram of one embodiment of a packaged module 900. FIG. 12B is a schematic diagram of a cross-section of the packaged module 900 of FIG. 12A taken along the lines 12B-12B.

The packaged module 900 includes radio frequency components 901, a semiconductor die 902, surface mount devices 903, wirebonds 908, a package substrate 920, and an encapsulation structure 940. The package substrate 920 includes pads 906 formed from conductors disposed therein. Additionally, the semiconductor die 902 includes pins or pads 904, and the wirebonds 908 have been used to connect the pads 904 of the die 902 to the pads 906 of the package substrate 920.

The semiconductor die 902 includes a Doherty power amplifier 945, which can be implemented in accordance with any of the embodiments herein.

The packaging substrate 920 can be configured to receive a plurality of components such as radio frequency components 901, the semiconductor die 902 and the surface mount devices 903, which can include, for example, surface mount capacitors and/or inductors. In one implementation, the radio frequency components 901 include integrated passive devices (IPDs).

As shown in FIG. 12B, the packaged module 900 is shown to include a plurality of contact pads 932 disposed on the side of the packaged module 900 opposite the side used to mount the semiconductor die 902. Configuring the packaged module 900 in this manner can aid in connecting the packaged module 900 to a circuit board, such as a phone board of a mobile device. The example contact pads 932 can be configured to provide radio frequency signals, bias signals, and/or power (for example, a power supply voltage and ground) to the semiconductor die 902 and/or other components. As shown in FIG. 12B, the electrical connections between the contact pads 932 and the semiconductor die 902 can be facilitated by connections 933 through the package substrate 920. The connections 933 can represent electrical paths formed through the package substrate 920, such as connections associated with vias and conductors of a multilayer laminated package substrate.

In some embodiments, the packaged module 900 can also include one or more packaging structures to, for example, provide protection and/or facilitate handling. Such a packaging structure can include overmold or encapsulation structure 940 formed over the packaging substrate 920 and the components and die(s) disposed thereon.

It will be understood that although the packaged module 900 is described in the context of electrical connections based on wirebonds, one or more features of the present disclosure can also be implemented in other packaging configurations, including, for example, flip-chip configurations.

CONCLUSION

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "may," "could," "might," "can," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

The above detailed description of embodiments of the invention is not intended to be exhaustive or to limit the invention to the precise form disclosed above. While specific embodiments of, and examples for, the invention are described above for illustrative purposes, various equivalent modifications are possible within the scope of the invention, as those skilled in the relevant art will recognize. For example, while processes or blocks are presented in a given order, alternative embodiments may perform routines having steps, or employ systems having blocks, in a different order, and some processes or blocks may be deleted, moved, added, subdivided, combined, and/or modified. Each of these processes or blocks may be implemented in a variety of different ways. Also, while processes or blocks are at times shown as being performed in series, these processes or blocks may instead be performed in parallel, or may be performed at different times.

The teachings of the invention provided herein can be applied to other systems, not necessarily the system described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A power amplifier system comprising:
a carrier amplifier configured to amplify a first radio frequency input signal;
a peaking amplifier configured to amplify a second radio frequency input signal; and
a combiner having a first input electrically connected to an output of the carrier amplifier, a second input electrically connected to an output of the peaking amplifier, and an output that provides a radio frequency output signal, the combiner including an inverter configured to provide an impedance inversion between the first input and the output of the combiner, and a first inductor and a first controllable in series and operable to provide harmonic termination to the output of the carrier amplifier, the first controllable capacitor having a capacitance that is controllable to tune both the inverter and the harmonic termination of the carrier amplifier, the first controllable capacitor including a plurality of circuit branches electrically connected in parallel, the plurality of circuit branches including a first circuit branch with a fixed capacitor and a second circuit branch with a series combination of a first field-effect transistor switch and a first switchable capacitor.

2. The power amplifier system of claim 1 wherein the combiner further includes a second inductor and a second controllable capacitor in series and operable to provide harmonic termination to the output of the peaking amplifier.

3. The power amplifier system of claim 2 wherein the first inductor and the first controllable capacitor are electrically connected in series between the output of the carrier amplifier and a ground voltage, and the second inductor and the second controllable capacitor are electrically connected in series between the output of the carrier amplifier and the ground voltage.

4. The power amplifier system of claim 3 wherein the inverter is connected between the output of the carrier amplifier and the output of the peaking amplifier.

5. The power amplifier system of claim 1 wherein the inverter includes a quarter wave transformer.

6. The power amplifier system of claim 1 further comprising an input splitter configured to receive a radio frequency transmit signal and to output the first radio frequency input signal and the second radio frequency input signal.

7. The power amplifier system of claim 6 further comprising an input signal selection circuit configured to select the radio frequency transmit signal from amongst two or more radio frequency transmit signals each associated with a different frequency band.

8. The power amplifier system of claim 7 wherein the radio frequency transmit signal is selected based on a band signal, the band signal further operable to control the capacitance of the first controllable capacitor.

9. The power amplifier system of claim 1 further comprising a series matching inductor connected between the output of the combiner and a radio frequency output terminal, and a shunt matching capacitor in shunt to the radio frequency output terminal.

10. The power amplifier system of claim 1 wherein the carrier amplifier includes a class AB bias circuit, and the peaking amplifier includes a class C bias circuit.

11. The power amplifier system of claim 1 wherein the first controllable capacitor and the first inductor provide harmonic termination at a second harmonic frequency of the first radio frequency input signal.

12. The power amplifier system of claim 11 wherein the plurality of circuit branches further include a third circuit branch with a second field-effect transistor switch and a second switchable capacitor.

13. A method of radio frequency amplification, the method comprising:
amplifying a first radio frequency input signal using a carrier amplifier that has an output connected to a first input of a combiner;
amplifying a second radio frequency input signal using a peaking amplifier that has an output connected to a second input of the combiner;
providing an impedance inversion between the first input of the combiner and an output of the combiner using an inverter of the combiner;
providing harmonic termination to the output of the carrier amplifier using a first inductor and a first controllable capacitor of the combiner, the first inductor and the first controllable capacitor in series; and
controlling a capacitance of the first controllable capacitor to tune both the inverter and the harmonic termination of the carrier amplifier, the first controllable capacitor including a plurality of circuit branches electrically connected in parallel, the plurality of circuit branches including a first circuit branch with a fixed capacitor and a second circuit branch with a series combination of a first field-effect transistor switch and a first switchable capacitor.

14. A mobile device comprising:
an antenna configured to transmit a radio frequency output signal; and
a front end-system including a power amplifier system including a carrier amplifier configured to amplify a first radio frequency input signal, a peaking amplifier configured to amplify a second radio frequency input signal, and a combiner having a first input electrically connected to an output of the carrier amplifier, a second input electrically connected to an output of the peaking amplifier, and an output that provides the radio frequency output signal, the combiner including an inverter configured to provide an impedance inversion between the first input and the output of the combiner, and a first inductor and a first controllable in series and operable to provide harmonic termination to the output of the carrier amplifier, the first controllable capacitor having a capacitance that is controllable to tune both the inverter and the harmonic termination of the carrier amplifier, the first controllable capacitor including a plurality of circuit branches electrically connected in parallel, the plurality of circuit branches including a first circuit branch with a fixed capacitor and a second circuit branch with a series combination of a first field-effect transistor switch and a first switchable capacitor.

15. The mobile device of claim 14 wherein the combiner further includes a second inductor and a second controllable capacitor in series and operable to provide harmonic termination to the output of the peaking amplifier.

16. The mobile device of claim 15 wherein the first inductor and the first controllable capacitor are electrically connected in series between the output of the carrier amplifier and a ground voltage, and the second inductor and the second controllable capacitor are electrically connected in series between the output of the carrier amplifier and the ground voltage.

17. The mobile device of claim 14 wherein the power amplifier system further includes an input splitter configured to receive a radio frequency transmit signal and to output the first radio frequency input signal and the second radio frequency input signal.

18. The mobile device of claim 17 wherein the power amplifier system further includes an input signal selection circuit configured to select the radio frequency transmit signal from amongst two or more radio frequency transmit signals each associated with a different frequency band.

19. The mobile device of claim 18 wherein the radio frequency transmit signal is selected based on a band signal, the band signal further operable to control the capacitance of the first controllable capacitor.

20. The mobile device of claim 14 wherein the plurality of circuit branches further include a third circuit branch with a second field-effect transistor switch and a second switchable capacitor.

\*    \*    \*    \*    \*